United States Patent [19]

Cooper et al.

[11] Patent Number: 5,049,841
[45] Date of Patent: Sep. 17, 1991

[54] ELECTRONICALLY RECONFIGURABLE DIGITAL PAD ATTENUATOR USING SEGMENTED FIELD EFFECT TRANSISTORS

[75] Inventors: Paul D. Cooper, Baldwinsville; Paul A. Bourdelais, Liverpool; Anthony W. Jacomb-Hood, North Syracuse; John A. Windyka, Liverpool; David R. Helms, Liverpool; Ronald J. Naster, Liverpool, all of N.Y.

[73] Assignee: General Electric Company, Syracuse, N.Y.

[21] Appl. No.: 551,067

[22] Filed: Jul. 11, 1990

[51] Int. Cl.$^5$ .............................. H03H 11/24
[52] U.S. Cl. .................... 333/81 R; 307/568
[58] Field of Search .................. 333/81 R, 81 A; 307/567, 568

[56] References Cited

U.S. PATENT DOCUMENTS

| | | | |
|---|---|---|---|
| 4,734,751 | 3/1988 | Hwang et al. | 333/81 RX |
| 4,875,023 | 10/1989 | Moaz | 333/81 R |
| 4,890,077 | 12/1989 | Sun | 333/81 A |
| 4,975,604 | 12/1990 | Barta | 333/81 R X |

*Primary Examiner*—Paul Gensler
*Attorney, Agent, or Firm*—Richard V. Lang; Paul Checkovich; Fred Jacob

[57] ABSTRACT

An electronically reconfigurable digital pad attenuator is disclosed using selectively controlled segmented field effect transistors in a passive, non-gain state as the principal impedance elements. The attenuator may be fabricated in the monolithic microwave integrated circuit (MMIC) format with a segmented gate field effect transistor being connected in each of the separate branches of a Pi pad, Tee pad, or Bridged Tee pad attenuator configuration. The individual FET segments are maintained in a high admittance "ON" state or a low admittance "OFF" state in accordance with the binary control potentials applied to the gate of each segment, the principal electrodes being maintained at a zero potential difference. The attenuation then becomes a function of the binary gate potentials applied to each segment and assumes one of a set of well-defined discrete values. The attenuator consumes minimum power, provides attenuation steps that are independent of GaAs MMIC fabrication process tolerances, i.e. lot to lot stable, is wide band, is well matched at input and output terminals, and facilitates setting nominal gain in microwave and millimeter wave subsystems while minimizing transmission phase variations without degrading dynamic range, extending dynamic range in communications receivers, and wide band accuracy in vector modulators.

17 Claims, 8 Drawing Sheets

FIG. 5A S21 MAGNITUDE VS FREQUENCY

FIG. 5B. S21 MAGNITUDE VS FREQUENCY

FIG. 6A. S21 MAGNITUDE VS FREQUENCY

FIG. 6B. S21 MAGNITUDE VS FREQUENCY

ELECTRONICALLY RECONFIGURABLE DIGITAL PAD ATTENUATOR USING SEGMENTED FIELD EFFECT TRANSISTORS

BACKGROUND OF THE INVENTION

1. Field of Invention

The invention relates to digital attenuators for radio frequency signals and more particularly to electronically reconfigurable pad attenuators in which a plurality of segmented gate field effect transistors are selectively controlled to provide a set of discrete attenuation values.

2. Prior Art

A major need for a reconfigurable attenuator is in low DC power consumption microwave and millimeter wave subsystems for setting nominal gain. In some applications the nominal insertion phase is also critical, and so to minimize calibration complexity, it is highly desirable to have an attenuator whose insertion phase is independent of the attenuation setting. In receivers it is important that the attenuator does not degrade the dynamic range.

A further important application is to provide an extension to the dynamic range of a communications receiver. Under large signal conditions it is desirable to attenuate the signal incident on the latter stages of the receiver to prevent intermodulation products which would result from non-linear operation and interfere with the detection and analysis process. Receivers requiring an extended dynamic range are used in radar systems, electronic warfare systems and communication systems.

A further need for an attenuator having wideband properties is in creating a wideband vector modulator. For this application two such attenuators may be used to adjust the magnitudes of the in-phase and quadrature vectors of a signal which, when recombined, produce a highly accurate phase shift with amplitude control. Such an application is described in Y. C. Hwang et al U.S. Pat. No. 4,638,190, assigned to the assignee of the present application and entitled "DIGITALLY CONTROLLED WIDEBAND PHASE SHIFTER". A wide band vector modulator requires a pair of wide band attenuators.

Three approaches to gain control are commonly used. One known approach utilizes variable gain amplifiers, either with analog bias control or with digital control of a segmented dual gate FET (SDGFET) device. The second approach utilizes conventional attenuators which are of an analog nature. The third approach cascades a series of two state attenuators to create a digital multistate attenuation.

The disadvantage in using a variable gain amplifier is its DC power consumption, typically several hundred milliwatts. These amplifiers have the further limitation of experiencing degradation in RF output power, noise figure and dynamic range when the gain is varied. Many variable gain amplifiers exhibit a large variation in the insertion phase as the gain is adjusted.

Conventional analog FET attenuators have a non-linear relationship between the control voltages and the attenuation characteristic when well matched performance is required. Linearization of this relationship may be achieved with off-chip silicon circuitry or on-chip gate balancing resistors coupled to a segmented gate FET, both methods consuming significant power. Linearization is a pre-requisite for digital control. The cost of implementing these approaches is increased because of the manufacturing variations between attenuators.

The cascade of two state attenuators typically has a high insertion loss and is inconveniently large to be realized as a low cost MMIC. This approach can also suffer from long settling times.

SUMMARY OF THE INVENTION

Accordingly, it is an object of the invention to provide a novel electronically reconfigurable digital attenuator.

It is another object of the invention to provide an electronically reconfigurable matched digital attenuator consuming minimum DC power.

It is still another object of the invention to provide an electronically reconfigurable digital attenuator whose attenuator changes are independent of GaAs MMIC process parameter tolerances.

It is a further object of the invention to provide a matched digital attenuator utilizing segmented single gate field effect transistors as the principal components.

It is an additional object of the invention to provide an electronically reconfigurable digital attenuator facilitating extended dynamic range.

It is a further object of the invention to provide an electronically reconfigurable digital attenuation whose insertion phase is substantially independent of the attenuation setting.

It is another object of the invention to provide an electronically reconfigurable digital attenuator having improved input and output matching.

It is still another object of the invention to provide an electronically reconfigurable digital attenuator providing improved wide band operation.

It is an additional object of the invention to provide an electronically reconfigurable attenuator with low insertion loss in the minimum attenuation state.

It is an additional object of the invention to provide an electronically reconfigurable attenuator with short settling time.

It is an additional object of the invention to provide a matched electronically reconfigurable digital attenuator suitable for monolithic microwave integrated circuit formation.

These and other objects of the invention are achieved in an electronically reconfigurable, attenuator providing a set of discrete small signal transfer (S21) values, fabricated in the monolithic microwave integrated circuit (MMIC) format, and comprising a monolithic crystalline substrate suitable for forming mutually insulated metallizations and field effect transistors (FETS). The several metallizations form nodes for application of an input signal, for internal signal connection, for derivation of an output signal, and for a common signal return for input, output and internal signals.

The field effect transistors included in the attenuator are segmented single gate field effect transistors formed on the monolithic crystalline substrate or chip. The FETs (typically two or three FETS are in an attenuator) are each subdivided into sets of selectively electronically controlled FET segments (typically 3 segments), each segment having a predetermined width to achieve a desired admittance. The segments include two principal electrodes in ohmic contact with the chip and a third electrode, usually insulated from the chip, forming a gate for electronically switching the segment to a high admittance "ON" state or to a low admittance "OFF" state in response to the state of an electrical digital control potential. The segments of each FET are connected in parallel to each other.

The respective segmented FETS are connected between the respective metallizations to form separate electronically reconfigurable branches of a Pi pad, a Tee pad, or a bridged Tee pad attenuator. Thus electronic selection of some of the segments of the FET in the high admittance "ON" state in each branch, leaving the other segments in low admittance "OFF" states, results in selecting discrete impedance values for each branch, and the states of the branches establish the discrete attenuation values of the attenuator.

The FET segments are operated in a passive, non-gain mode allowing bidirectional conduction by maintaining the respective metallizations connected to the principal electrodes at a common dc potential. Thus certain individual segments of the FETs are put in a high admittance "ON" state with other segments remaining in a low admittance "OFF" state in response to the states of a plurality of digital control potentials applied to the gate electrodes. Electrically setting the potentials on the gates of all the segments thus selects a particular attenuation value for the attenuator.

The resulting attenuator is a well matched, wide band device, providing discrete attenuations and facilitating a 5 to 10 dB improvement in dynamic range in comparison to other known gain control elements using FETS. It can also provide highly accurate phase settings in vector modulators.

In accordance with a further feature of the invention, resistors are provided, serially connected with each segment to divide the RF signal voltage applied to each FET segment, and thereby facilitate operation of the attenuator with RF signals of higher amplitude.

BRIEF DESCRIPTION OF THE DRAWINGS

The inventive and distinctive features of the invention are set forth in the claims. The invention itself, however, together with further objects and advantages thereof may best be understood by reference to the following description and accompanying drawings, in which:

DESCRIPTION OF THE PREFERRED EMBODIMENT

Figure 1:
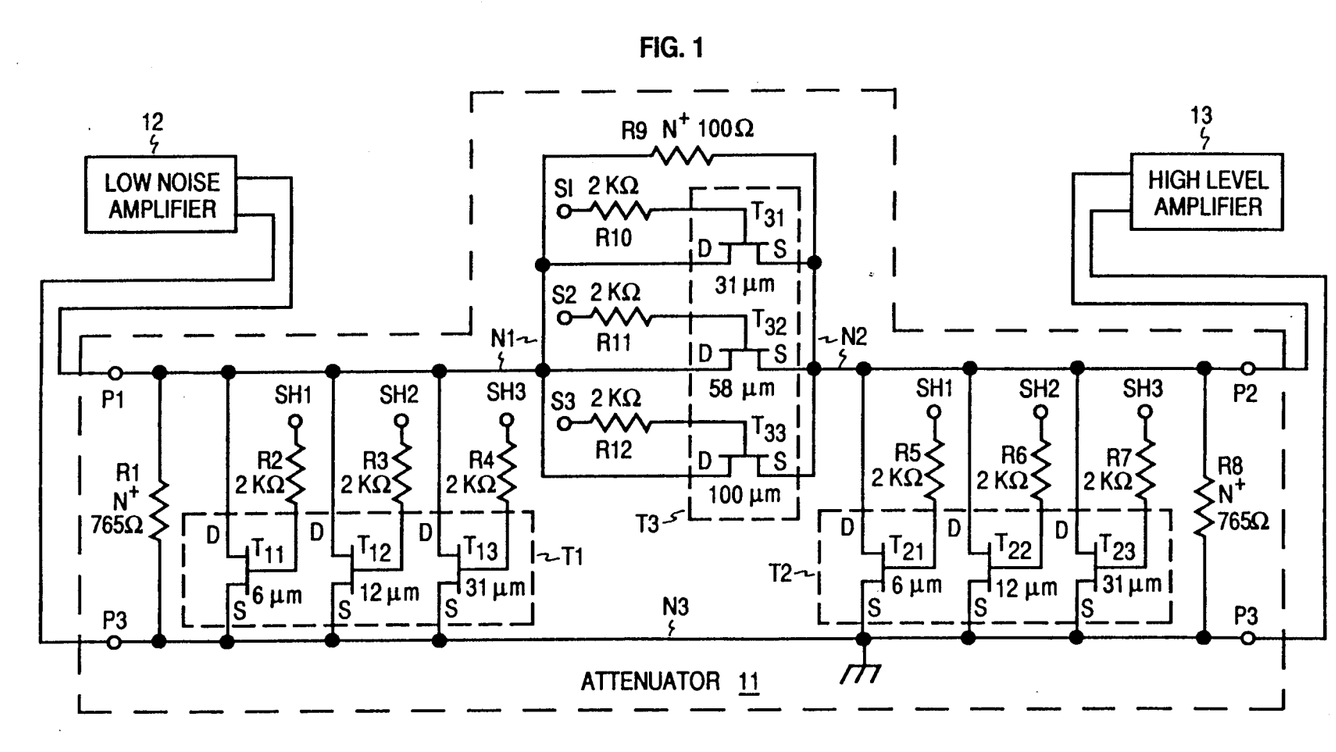
FIG. 1 is a circuit diagram of a segmented gate field effect transistor (FET) attenuator providing a set of small signal transfer values (S21) in accordance with a first embodiment of the invention.

FIG. 1 is a circuit diagram of a novel segmented gate field effect transistor (FET) attenuator 11 shown connected between a low noise amplifier 12 and a high level amplifier 13. In this configuration, the attenuator provides a set of 31 discrete small signal transfer (S21) values matched to 50 ohm input and output impedances with a return loss (S11 magnitude and S22 magnitude) of greater than 19 dB.

Figure 4A:
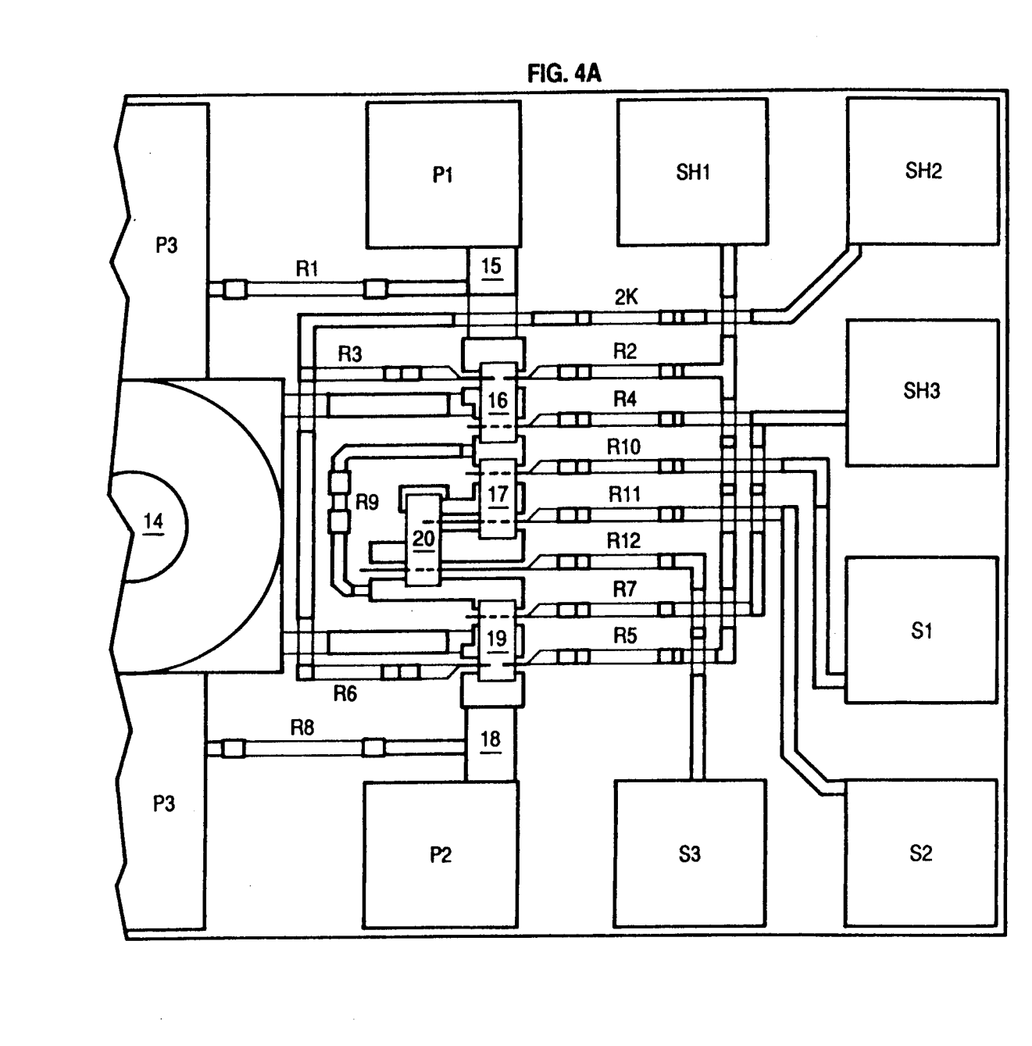
FIG. 4A is a plan view of the layout of the first embodiment, which is fabricated in the MMIC format
Figure 4B:
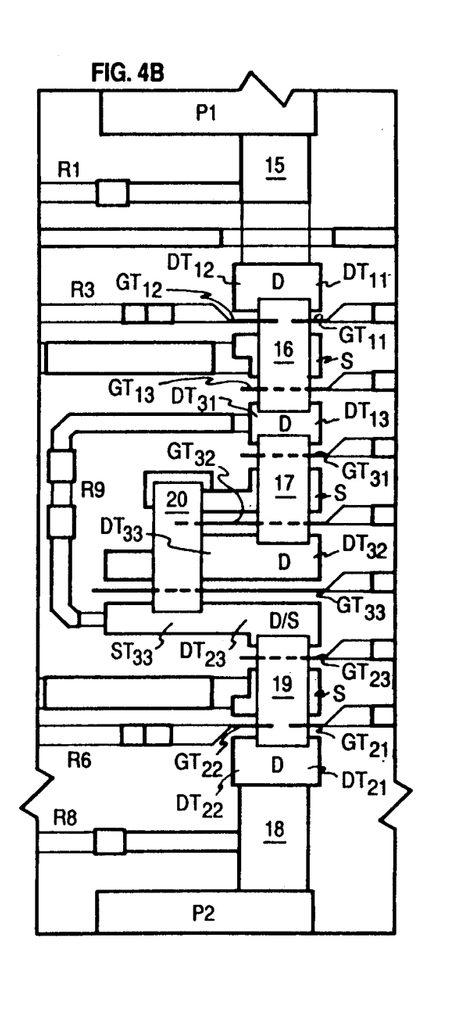
FIG. 4B is an expanded view of the gate region of the first embodiment.

The attenuator is fabricated in a monolithic microwave integrated circuit (MMIC) format as generally illustrated in FIGS. 4A and 4B. The attenuator may be regarded as consisting of three segmented gate field effect transistors (T1, T2, T3). The three transistors are formed in a single monolithic crystalline substrate of semi-insulating material such as Gallium Arsenide and are interconnected between three nodes N1, N2, N3, formed by three surface metallizations. The result is a reconfigurable Pi network providing the 31 S21 values mentioned above.

In the illustrated attenuator, the 31 S21 values, which correspond to 31 discrete states of the three FETs, are distributed between the range of from $-2$ to $-13$ dB. The practical frequency range of the attenuator is from 100 megahertz to 11 gigahertz but in principle the response goes to DC. The performance of two embodiments of the attenuator in S21 amplitude and S21 phase is illustrated in FIGS. 5A, 5B and 6A and 6B, respectively.

The novel attenuator, in accordance with a first embodiment of the invention, is best described with joint reference to FIGS. 1, 4A and 4B. As noted earlier, the attenuator 11 is connected between a low noise amplifier 12 and a high level amplifier 13. The three blocks represent a part of a receiving channel of, for example, a phased array radar system. (The attenuator may equally be used in transmit channels.) In this case, the function of the attenuator 11 is to set a nominal gain level and to provide a means for extending the dynamic range beyond that possible from a conventional variable gain amplifier.

The blocks (11, 12, and 13) represent portions of a receiving channel, and all may be configured in the monolithic microwave integrated circuit (MMIC) format which is generally suitable for use over the frequency range of from 1 to 100GHZ. The blocks are intended for use in receiving channels associated with individual elements of a phased array radar antenna system, where they would be used in quantities of from several hundred to several thousand per array.

The novel attenuator, when used in a phased array radar system, is designed to extend the spurious free dynamic range (SFDR) of a receiving channel. In the FIG. 1 embodiment, which assumes a 2 to 13 dB attenuation range, a nominal SFDR of approximately 85 dB may be achieved across the whole attenuation range. The 85 dB SFDR value represents a 5 to 10 dB performance improvement at the upper and lower limits over that of a known variable gain amplifier configuration with the same maximum and minimum gain and DC power consumption. The disclosed attenuator may be designed to meet other performance specifications and to exhibit greater or lesser attenuation ranges in greater or lesser numbers of steps.

Continuing, the output terminals of the low noise amplifier 12 are connected to the pads P1 and P3 of the attenuator 11. Similarly, the pads P2 and P3 of the attenuator are connected to the input terminals of the high level amplifier 13. The sequence of blocks in FIG. 1 assumes that the signal passes from left to right in the circuit diagram and that the pads P1 and P3 are input signal pads, and that the pads P2 and P3 are output signal pads. In addition, the principal electrodes (those in ohmic contact with the semiconductor regions) of the three FETs (TI T2, and T3) bear the legends "S" and "D". As will be seen, these legends are arbitrary, since each FET device, and each segment of each FET device, is operated without bias between the principal electrodes, other than that provided by the signal. Thus, for instance the signal could flow from right to left within the attenuator 11, rather than as illustrated, typical of a reciprocal passive Pi-pad attenuator. The gate electrode of each segment, as will be explained, is provided with suitable biasing means referenced to the principal electrodes to activate or deactivate each segment. Each segment thereupon operates as a passive impedance element without gain and it operates bidirectionally.

The pads P1, P2 and P3, formed on insulating regions of the GaAs chip (FIGS. 4A and 4B), are connected to three metallizations N1, N2 and N3, respectively. These metallizations, which are also formed in an insulated relation to one another on the Gallium Arsenide chip, become the principal internal nodes for interconnection of the FET segments selectively controlled in forming a reconfigurable Pi-pad attenuator.

The FET segments are formed in doped, semiconducting regions of the chip in a conventional manner with the principal electrodes (i.e. "source and drain" electrodes) being in ohmic contact in a doped region common to the same FET. The gate region lies between source and drain regions, with the gate electrode insulated from the source and drain (principle electrodes) so that the electric field produced by a potential applied to the gate will control conduction between the principal electrodes as is customary in a field effect device. The circuit technique is equally applicable to all compound semiconductor field effect transistors including MESFETS and HEMTS.

Continuing with the circuit description of the FIG. 1 embodiment, a first 765Ω resistor R1 and the three segments (T11, T12, T13) of the FET T1 are each connected between the metallizations N1 and N3. As illustrated, the principal electrodes of the segments T11, T12, T13 marked "D" are connected to the metallization N1 and those marked "S" are connected to the metallization N3. The gates of the three segments (T11, T12, T13) are connected respectively via 2000Ω resistors R2, R3 and R4 to the control pads marked SH1, SH2, SH3. As indicated in FIG. 1, the segment T11 has a gate width of 6 microns, the segment T12 has a gate width of 12 microns and the segment T13 has a gate width of 31 microns, the stepped gate widths producing stepped impedance values.

The three segments (T21, T22, T23) of the FET T2 and a second 765Ω resistor R8 are connected between the metallizations N2 and N3. As illustrated, the principal electrodes marked D are connected to the metallization N2 and those marked S are connected to the metallization N3. The gates of the three segments (T21, T22, T23) are connected via 2000Ω resistances R5, R6, and R7 to the control pads marked SH1, SH2, SH3, as were the gates of the three segments T11, T12, T13. Correspondingly numbered segments that are turned on in FET T1 will also be turned on in FET T2. As illustrated, the segment T21 has the same gate width as segment T11 and the segment T22 has the same gate width as the segment T12 and the segment T23 has the same gate width as the segment T13.

A further 100Ω resistor R9 and three segments (T31, T32, T33) of the FET T3 are each connected between the metallizations N1 and N2. The principal electrodes of the segments marked D are connected to the metallization N1 and those marked S are connected to the metallization N3. The gates of the segments are connected respectively via 2000Ω resistances R10, R11 and R12 respectively to the control pads marked S1, S2 and S3.

The layout of the FIG. 1 embodiment of the attenuator chip is illustrated in FIGS. 4A and 4B. The GaAs chip is 0.720 by 0.830 millimeters in overall dimensions (including a 0.075 millimeter border) with pads arranged along the perimeter of the chip at approximately 0.150 millimeter pitch. The signal input pad P1 is arranged at the top of the chip towards the center while the pad P2 is shown at the bottom of the chip also toward the center. The semiconductor regions of the three FET transistors T1, T2, and T3 are arranged in a line between these two pads.

The segment control pads SH1, SH2, SH3, S1, S2 and S3 are arranged clockwise in the order recited around the right hand side of the chip between pads P1 and P2. The ground pads P3 on the left hand side of the chip, which provide a signal ground for test purposes, are connected through the via hole 14 to the metallization applied to the undersurface of the monolithic chip which is associated with substrate ground. The metallization electrically common to the pads P3, the via hole and the metallization on the undersurface of the chip form the node N3. In the input and output signal connections in a hybrid circuit, the under-surface metallization is used for the signal ground.

As shown in FIGS. 4A and 4B, the metallization N1 connected to the pad P1 extends downward from pad P1 through the active semiconductor region and consists of three sections 15-17. The first section 15 is branched to the left to make connection via resistor R1 to node N3, and continues downward to make contact with the drain electrode shared by T11, T12. Continuing downward, the second section 16 is an airbridge making contact with the drain electrode shared between T13 and T31. The third section 17 is an airbridge making contact with a third drain electrode shared between T32 and T33.

Continuing, the metallization N2 connected to the pad P2 extends upward from pad P2 through the active semiconductor region and consists of three sections 18, 19, and 20. The first section 18 is branched to the left to make connection via resistor R8 to node N3, and continues upward to make contact with the drain electrode shared between T22 and T21. Continuing upward, the second section 19 is an airbridge making contact with the drain electrode for T23 and the source electrode for T33. The third section 20 of the metallization extends to the left and then upward as an airbridge to the source electrode shared between T31 and T32.

Concluding, the airbridge 16 spans the source electrode for T11, T12, and T13. Also, the airbridge 19 spans the source electrode for T21, T22, and T23. The gates of the nine segments may be identified on FIGS. 4A and 4B by their connection via the 2K ohms resistances to the six pads used for applying the segment activating potential.

Figure 5A:
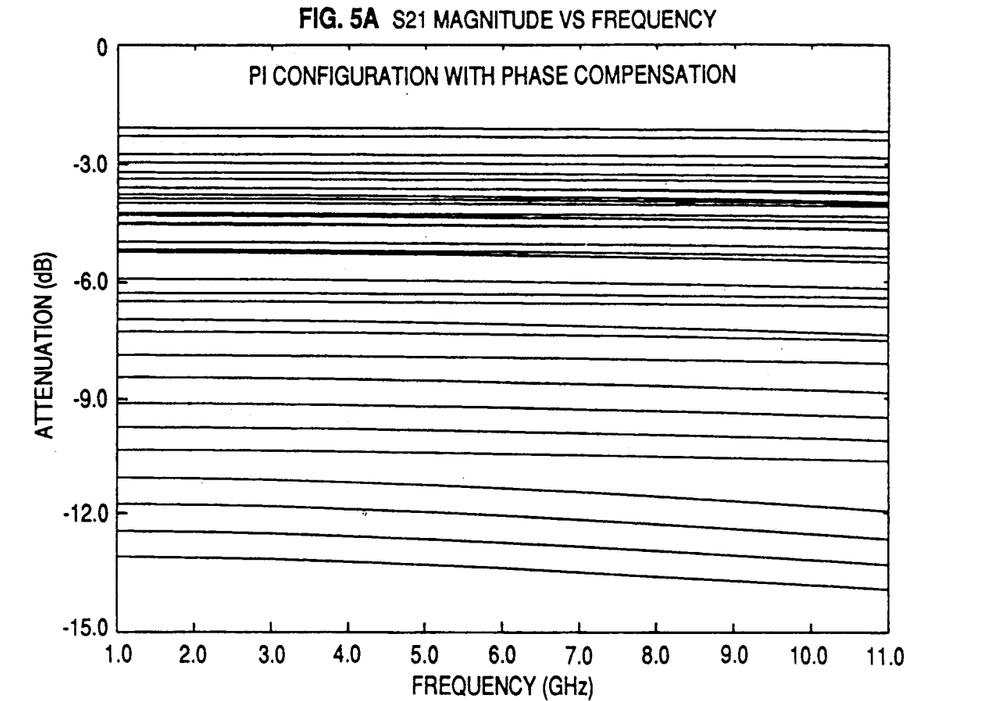
FIGS. 5A and 5B are graphs of the attenuation states versus frequency of the first embodiment with phase compensation (as in the third embodiment) and without phase compensation, respectively.
Figure 5B:
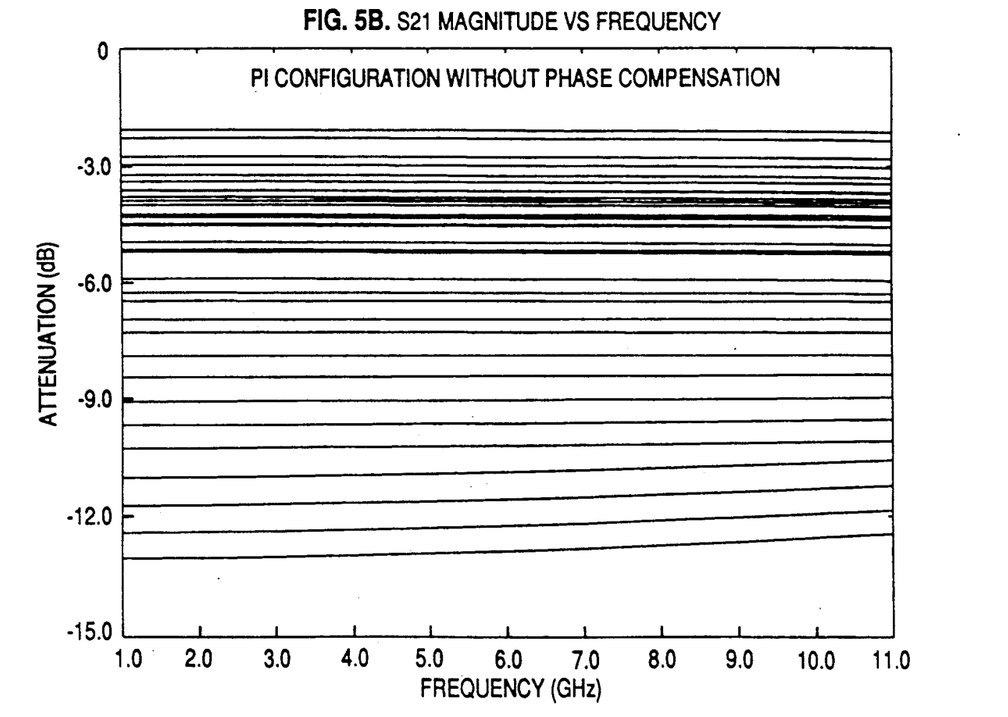
Figure 6A:
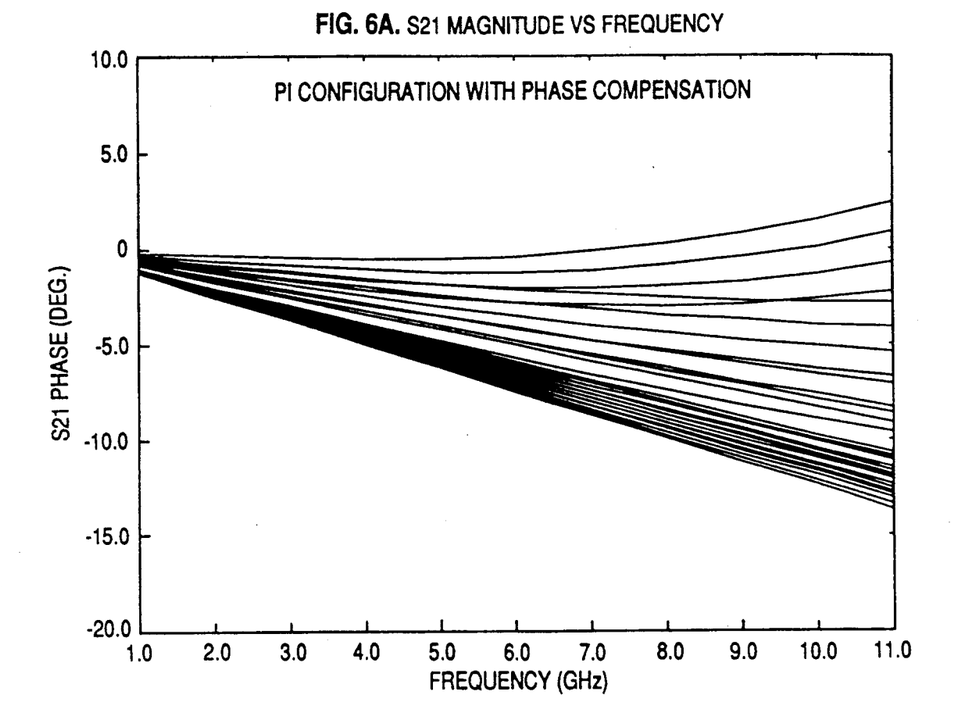
FIGS. 6A and 6B are graphs of the phase versus frequency response of the first embodiment with phase compensation (as in the third embodiment) and without phase compensation, respectively.
Figure 6B:
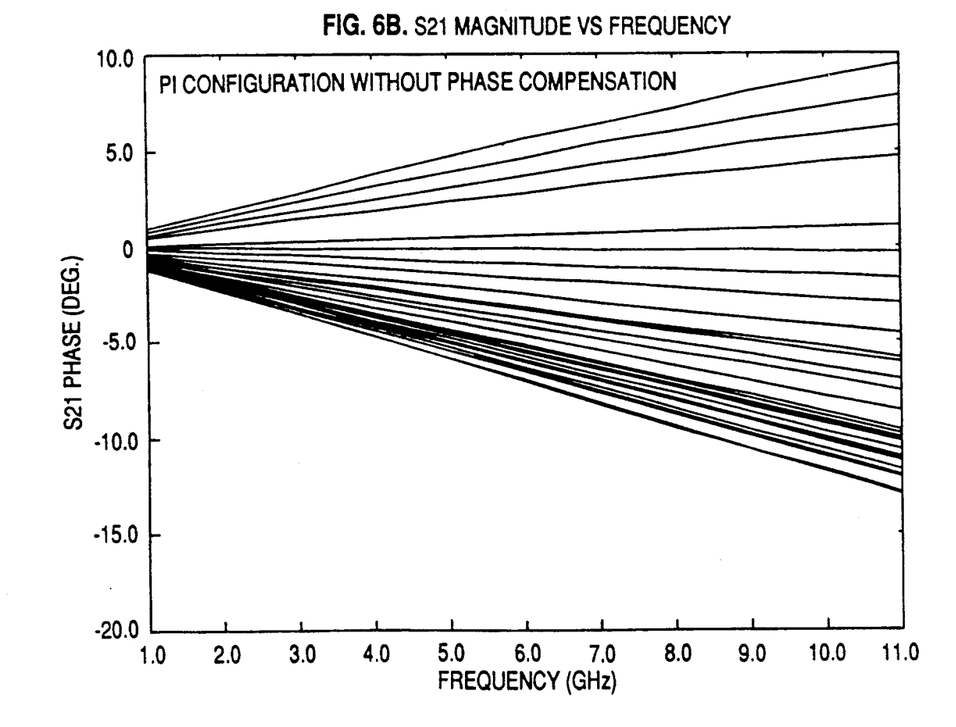

The predicted performance of the FIG. 1 embodiment is illustrated in FIGS. 5B and 6B. FIG. 5B shows the 31 attenuation states (S21 magnitude) as a function of frequency over the 1-11GHZ band and FIG. 6B shows the 31 phase states (S21 phase) as a function of frequency, each case retaining a return loss of approximately 19 dB or greater. The S21 magnitude is less than ideal in that the magnitudes of successive states are generally closer at lower values and in that the attenuation droops from the low frequency end of the spectrum to the high frequency end. The S21 phase converges at the low frequency end of the spectrum and diverges to approximately +10° to −13° at 11GHZ. In many applications, the phase dispersion is unimportant.

The FIG. 1 embodiment is designed to assume each of 31 distinct states by the application of control voltages to the six control pads S1, S2, S3, and SH1, SH2, SH3. The resistors R2, R3, R4, R5, R6, R7, R10, R11, R12, which are all of 2K ohms and are inserted in series with the control pads are designed to provide RF signal isolation for the gate control circuits. The FET segments are individually designed to go "ON" with a gate bias of zero or near zero volts in relation to substrate ground supplied via the control pads. In the "ON" state, the resistance of a segment may be calculated by dividing the number $4000\Omega.\mu m$ by the gate width in $\mu m$. In the "ON" state, the individual segments can be quite accurately modeled as a simple resistance uncomplicated by capacitive reactance.

In the "OFF" state which is produced by applying a negative gate bias of −3 volts in relation to the substrate ground, the turned off segment is now modeled as a series resistance of half the former value ($2000\Omega.\mu m$ divided by the gate width in $\mu m$) connected in series with a capacitor having a value of 0.3FF per $\mu m$ of gate width. At frequencies of interest, the capacitive reactance is very high (e.g. the 6 $\mu m$ device has an ON resistance of 667Ω and an OFF impedance of 18KΩ at 5 gigahertz), dominating the relation, and providing a satisfactorily high "ON" to "OFF" impedance ratio. The reactance of the "OFF" segments, however, is present and distorts the performance as illustrated in FIGS. 5B and 6B.

As FIG. 1 illustrates, the input and output shunt branches of the Pi network are arranged to remain symmetrical as the attenuation states are stepped. This is achieved by connecting similarly dimensioned segments of the input shunt FET T1 and of the output shunt FET T2 to the same control terminal (SH1, SH2, SH3).

A further feature in the design is the provision of shunt resistances R1, R8 and R9 paralleling the segmented FETs T1, T2 and T3. The resistors R1 and R8, which parallel the FETs T1 and T2, are 765Ω and set the maximum resistance of the shunt branches of the Pi-pad attenuator. Similarly, the resistance R9 of 100Ω which parallel the FET T3 sets the maximum resistance of the series branch.

In arriving at the optimum circuit values for the gate widths and for the shunt resistors, the objective was to provide attenuation states with minimum phase variations, a return loss (S11 magnitude) of greater than 19 dB and equal sized attenuation steps over the attenuation range, given a Pi-pad attenuator configuration of no more than three segments per branch. A greater density in states could be achieved with the same number of segments, but would fall below 19 dB of S11 magnitude (return loss). A somewhat larger number of segments than three per branch, but three proved to be satisfactory for the application, would also increase the density of the attenuation states. The simplicity of the Pi-pad attenuator allowed the use of a simple resistor model for each transistor segment with a "FORTRAN" program in the first optimization of the circuit at dc or low frequencies. The parasitic capacitances (in the "OFF" states) and other layout related parasitics were then added to model the circuit at intended higher frequencies. The circuit analysis was achieved using "SUPER COMPACT". Slight adjustments in the gate widths and resistor values were made to compensate for the parasitic capacitances which produced the phase variations best seen in FIGS. 6A and 6B.

The values of the shunt resistors R1, R8 and R9 were chosen to equal the maximum desired resistance state of each branch thereby defining the branch resistance when all the segments of the FETs are "OFF".

The Pi-pad attenuator tends to provide an unequal logarithmic stepping of the attenuation states having smaller steps in low attenuation states and larger steps in the high attenuation states. The FIG. 1 values have accordingly been optimized to yield the most equally distributed attenuation states for a Pi-pad attenuator assuming three segments per branch.

Figure 2:
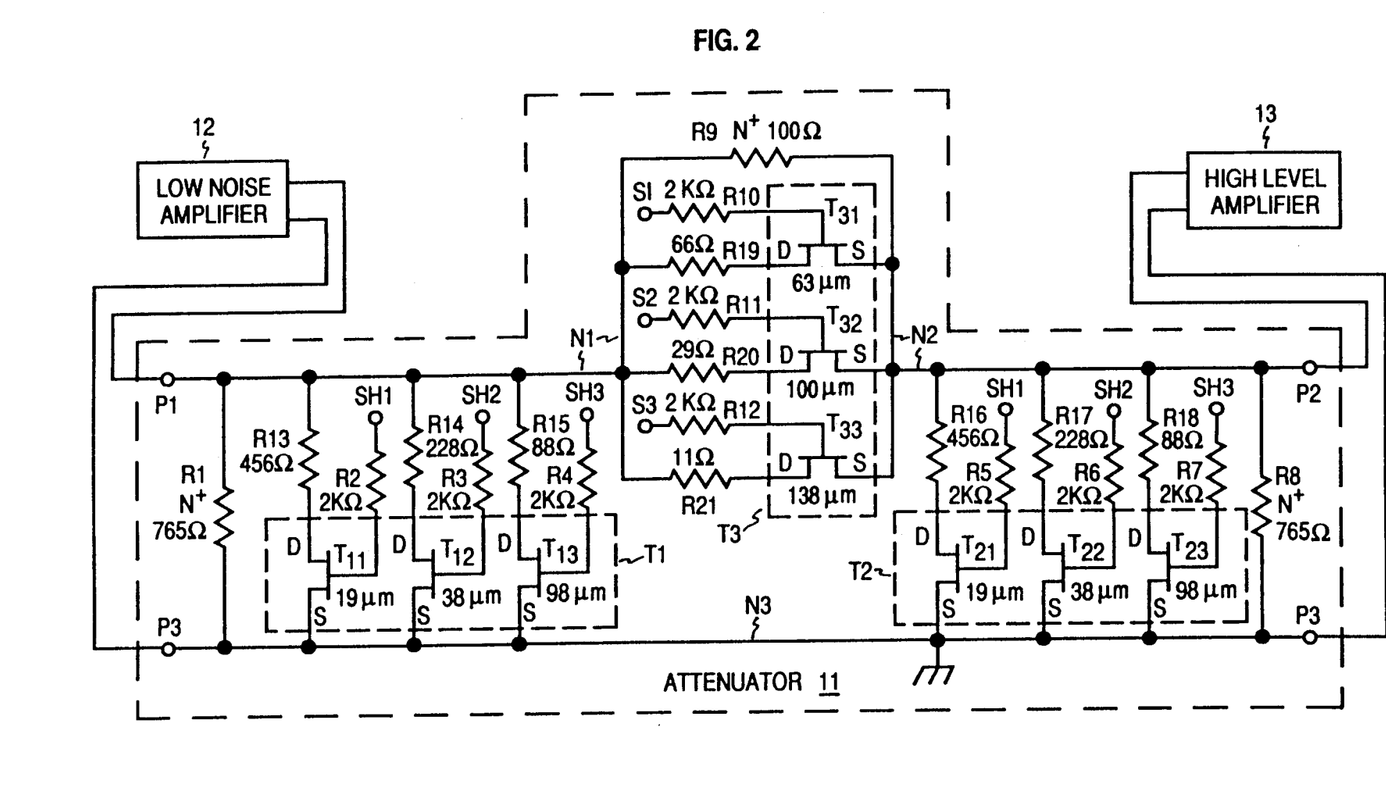
FIG. 2 is a circuit diagram of a segmented gate FET attenuator, having increased RF power handling capacity in accordance with a second embodiment of the invention.

The FIG. 1 embodiment is power limited by the RF voltage swing that the FET T1 can handle. In the event that increased power handling is desired, fixed resistors may be added in series with each segment as shown in FIG. 2. In the embodiment, the individual resistances are matched to the resistances of the individual FET segments to give a signal voltage ratio of 1 to $\sqrt{10}$ across the FETs. This is an arbitrary selection providing a 10 to 1 improvement in power handling capability. The indicated design produces a small decrease in the attenuator performance from that of the FIG. 1 embodiment. The selection of less than a 10 to 1 improvement in power handling, when appropriate, reduces the adverse affect upon performance.

Each modified path in the FIG. 2 embodiment substantially repeats the electrical design of the corresponding portion in the first embodiment. For example, the resistance provided by the first segment of the transistor T1 between nodes N1 and N3, are thus intended to remain the same in the FIG. 2 embodiment. Since the addition of a serial resistance (R13) will increase the total resistance in shunt between the nodes N1 and N3, the gate width is correspondingly increased to bring the FET "ON" resistance down to hold the total resistance constant. Since the resistance of each segment is inversely proportional to gate width ($4000\Omega.\mu m$), the first segment (T11) of 6$\mu m$ gate width in the first embodiment has a resistance of 666.67Ω. In the second embodiment the gate width of the first segment (T11) is increased by a factor of $\sqrt{10}$ to 19$\mu m$ and has a corresponding resistance of 210.8Ω. When the resistor R13 of 456Ω is added in series with the 210.8Ω segment, the 666.67Ω resistance of the first branch of the first embodiment is equaled.

The other segments are similarly designed. The gate width is increased in each case by the factor $\sqrt{10}$, and a serial resistance is added to bring the resistance of the new branch (when conductive) to the original value of the old branch (when conductive).

As illustrated in FIG. 6B, there is substantial (+10° to −13°) phase dispersion in the FIG. 1 embodiment when operated over the 1 to 11 gigahertz frequency spectrum. Tuning of the network to compensate for the gate capacity by the addition of inductance in series with resistor R9 in FIG. 1 may be used to reduce the dispersion.

In particular, compensation of the FIG. 1 embodiment may be achieved by adding an inductance of 0.5 nanoHenry in series with the 100Ω resistance R9. The computed results after compensation are illustrated in FIGS. 5A and 6A. The dispersion of the S21 phase has been greatly reduced in certain portions of the spectrum. In particular, at 5GHZ it has been reduced from ±5.5° to 0° to −6°. An embodiment combining both enhanced power handling and phase compensation is illustrated in FIG. 3, with suitable component values provided.

Figure 3:
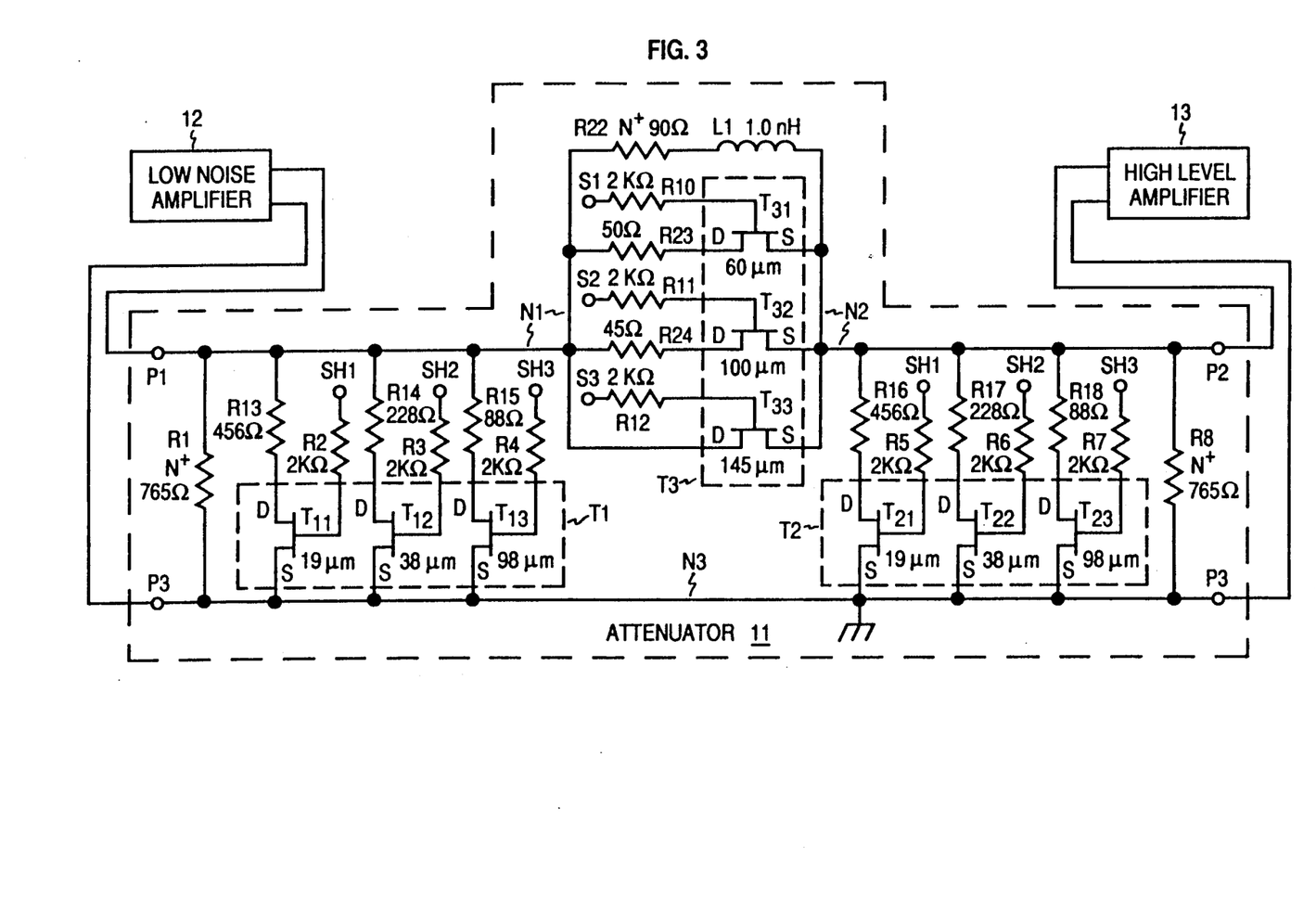
FIG. 3 is an electric circuit diagram of a segmented gate FET attenuator having improved transmission phase response (S21 phase) in accordance with a third embodiment of the invention.

The embodiments illustrated in FIGS. 1-3 are inventive examples in which three segmented gate FETs form separate branches in a Pi-pad attenuator. Arrangements in which the segmented gate FETs form separate branches in a Tee-pad attenuator or in which the segmented gate FETs form branches in a bridged Tee-pad attenuator are additional examples of the invention.

Figure 7:
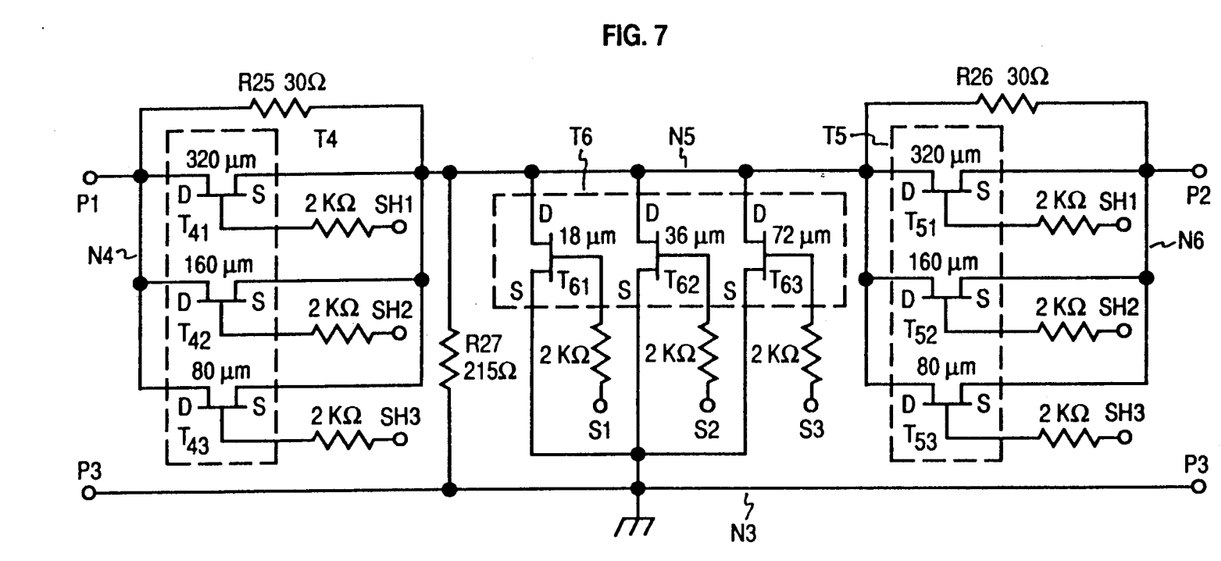
FIG. 7 is a circuit diagram of a segmented gate FET attenuator connected as a Tee pad attenuator in accordance with a fourth embodiment.

The circuit diagram of an arrangement in which three segmented gate FETs form a Tee-pad attenuator is provided in FIG. 7. As before, resistances (R25, R26, R27) are provided to set maximum impedances for each branch. Optionally two inductors may be provided to minimize phase dispersion, one connected in series with resistor 25 between nodes N4 and N5 and the other connected in series with resistor 26 between nodes N5 and N6. The FIG. 7 attenuator is designed to be connected between a low noise amplifier and a high level amplifier means of its input terminals P1, P3 and output terminals P2, P3 respectively. The input and output impedances are 50Ω as in the prior embodiments.

The first segmented transistor T4 of the FIG. 7 embodiment forms the input serial element connected between the input pad P1 (also node N4) and node N5. As in the prior examples, transistor T4 is subdivided into three selectively controlled FET segments T41, T42, T43 with the three "D" electrodes being connected to P1 (also node N4), and the three "S" electrodes being connected to the node N5.

The second segmented transistor T5 of the FIG. 7 embodiment forms the output serial element connected between node N5 and the output pad P2 (also node N6). The transistor T5 is subdivided into three selectively controlled FET segments T51, T52, T53 with the three "D" electrodes being connected to the node N5, and the three "S" electrodes being connected to the pad P2 (also node N6).

The third segmented transistor T6 of the FIG. 7 embodiment forms the shunt element connected between the node N5 and node N3, the common signal return for input/output and internal signals. Transistor T6 is subdivided into three selectively controlled FET segments T61, T62, T63 with the three "D" electrodes being connected to the node N5 and the three "S" electrodes being connected to the node N3.

The foregoing FIG. 7 embodiment is intended to be selectively controlled in the same general manner as illustrated in the prior figures. In particular, the serial input and output segments are switched ON, and OFF symmetrically. This is achieved by connecting the gates of segments T41 and T51 to a common control terminal SH1; the gates of segments of T42 and T52 to common control terminal SH2; and the gates of segments T43 and T53 to the common control terminal SH3. The shunt FET segments T61, T62 and T63 of transistor T6 are connected separately to control terminals S1, S2, and S3.

The Tee network of FIG. 7 provides more equal attenuation steps and avoids the clustering of steps at the lower attenuations as illustrated in FIGS. 5A and 5B for the Pi network. The Tee network is thus to be preferred where more even steps is a primary concern. On the other hand, the Pi network provides less phase dispersion than the Tee network. Accordingly, in applications where a low phase dispersion is more significant, the Pi network is normally to be preferred over the Tee network.

Figure 8:
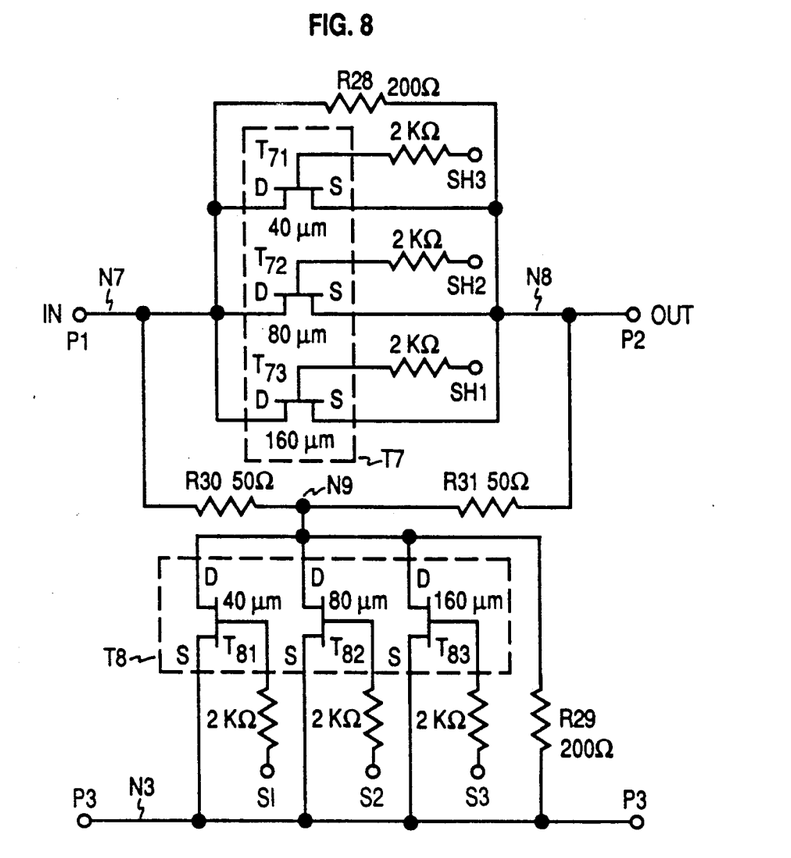
FIG. 8 is a circuit diagram of a segmented gate FET attenuator connected as a bridged Tee pad attenuator in accordance with a fifth embodiment.

The circuit diagram of an arrangement in which the segmented resistors form a bridged Tee pad attenuator is provided in FIG. 8. The FIG. 8 attenuator is designed to be connected between a low noise amplifier and a high level amplifier by means of its input terminals P1, P3 and output terminals P2, P3, respectively. Both input and output impedances are 50Ω as in the prior embodiments. The attenuation range is also 2-13 dB as in the previous embodiments.

The first segmented transistor T7 of the FIG. 8 embodiment is serially connected between the input pad P1 (also node N7) and the output pad P2 (also node N8), and shunted by resistor R28. The transistor T7 is subdivided into three selectively controlled FET segments T71, T72, T73 with the three "D" electrodes being connected to the pad P1 (node N7) and the three "S" electrodes being connected to the node N8 (pad P2).

The second segmented transistor of the FIG. 8 embodiment forms a shunt element connected between the node N9 and the common ground and signal return node N3. A first 50Ω resistor R30 is connected between pad P1 (node N7) and node N9. A second 50Ω resistor R31 is connected between node N9 and node N8 (pad P2). Transistor T8 is subdivided into three selectively controlled FET segments T81, T82, T83 with the three "D" electrodes being connected to the node N9 and the three "S" electrodes being connected to the node N3. The transistor T8 is shunted by resistor R29.

As with the other embodiments, phase dispersion may be minimized by the provision of a first inductor connected in series with resistor R28 between nodes N7 and N8 and a second inductor connected in series with resistor R29 connected in series between nodes N3 and N9.

The bridged Tee -pad attenuator represents a compromise between the Tee and the Pi-pad attenuators in that the phase dispersion is lower than the Tee pad attenuator while the attenuation steps are more equally spaced than the Pi-pad attenuator.

Four sections of the embodiment of FIG. 8 when configured in a classic "Balanced Ring" provides a further enhancement in phase dispersion and equal attenuation steps.

The attenuator embodiments so far discussed, have been used to provide "6" bit operation implying 64 discrete attenuation states. This is achieved by the use of three segments in each branch providing 8 impedance combinations (i.e. one state with all segments "OFF"; three states of one segment "ON" at a time; three states of two segments "ON" at a time; and finally one state of all three segments "ON" at a time) and by switching the branches in two independent sets. Since the three branch Pi-pad and Tee-pad attenuators require 50Ω input and 50Ω output impedance matching, the two shunt branches in the Pi-pad attenuator and the two series branches in the TEE-pad attenuator must have identical impedance states. With the limitation that only two sets of branch states are available, the number of possible states is $2^6$ or 64. this limitation in states applies to both the Pi-pad, the Tee-pad and the bridged Tee-pad attenuator. However, the requirement of a good match (S11, S22 below −19 db) forces one to be selective from among the 64 available states. The selection of "valid" states may be achieved by use of an IC truth table. A suitable table for the FIG. 1 embodiment at 5GHZ is provided below.

| STATE # | 6 BIT WORD* | S21 (dB) | S21 (ANG) | S11 (dB) |
|---|---|---|---|---|
| 1  | 111000 | −2.06  | −5.9 | −20.4 |
| 2  | 011000 | −2.27  | −5.9 | −19.0 |
| 3  | 111100 | −2.75  | −5.5 | −27.1 |
| 4  | 011100 | −3.00  | −5.5 | −25.1 |
| 5  | 101100 | −3.23  | −5.5 | −22.8 |
| 6  | 111010 | −3.40  | −5.0 | −26.5 |
| 7  | 011010 | −3.63  | −5.1 | −28.8 |
| 8  | 001100 | −3.63  | −5.5 | −20.1 |
| 9  | 110100 | −3.81  | −5.3 | −19.0 |
| 10 | 101010 | −3.90  | −5.0 | −29.4 |
| 11 | 111110 | −4.00  | −4.6 | −21.1 |
| 12 | 011110 | −4.25  | −4.6 | −23.0 |
| 13 | 001010 | −4.32  | −5.1 | −26.4 |
| 14 | 110010 | −4.51  | −4.8 | −24.6 |
| 15 | 101110 | −4.53  | −4.6 | −25.4 |
| 16 | 001110 | −5.00  | −4.6 | −29.7 |
| 17 | 110110 | −5.20  | −4.4 | −30.3 |
| 18 | 010010 | −5.23  | −4.5 | −19.8 |
| 19 | 010110 | −5.90  | −3.9 | −25.4 |
| 20 | 001001 | −6.30  | −3.5 | −19.1 |
| 21 | 110001 | −6.50  | −3.2 | −20.0 |
| 22 | 100110 | −7.00  | −2.8 | −19.3 |
| 23 | 010001 | −7.30  | −2.7 | −24.5 |
| 24 | 010101 | −7.90  | −2.1 | −20.4 |
| 25 | 100001 | −8.44  | −1.4 | −30.7 |
| 26 | 100101 | −9.10  | −0.8 | −26.2 |
| 27 | 100011 | −9.67  | −0.1 | −21.7 |
| 28 | 000001 | −11.00 |  2.4 | −19.7 |
| 29 | 000101 | −11.60 |  3.1 | −24.3 |
| 30 | 000011 | −12.30 |  3.9 | −30.2 |
| 31 | 000111 | −13.00 |  4.7 | −28.2 |

(*Order or Bits S1, S2, S3, SH1, SH2, SH3)

The number of valid states may be decreased by tightening the S11 specification, while not reducing the number of segments or it may be decreased by using smaller numbers of segments. The number of valid states may be increased by releasing the S11 specification or by increasing the number of segments per branch. The parasitic capacitances present in the "OFF" state, introduces a frequency dependent phase shift and tends to limit the bandwidth at higher frequencies. Over a given frequency band inductance compensation may be introduced to permit a larger number of segments while maintaining S21 amplitude and phase performance.

The three segment design is convenient, and electrically efficient, and these attributes may be sacrificed if the number of segments becomes too large.

The attenuators herein described may be employed at microwave and millimeter wave frequencies. They are readily constructed in the monolithic microwave integrated circuit format in which the monolithic substrate is of a semi-insulating material such as Gallium Arsenide or one of the other compound semiconductors in the III-V or II-VI families which have suitably high electron mobilities. The MMIC format implies that the active devices, field effect transistors in the present case, are formed on the chip by ion implementation or mesa processes and interconnected by conductor runs including resistors, capacitors and inductors which are formed on the surface of the substrate.

The arrangements herein described employ the selected individual segments of an FET in a "passive" mode with the principal electrodes, nominally sources and drains, being interchangeable and having no applied potential difference. In this mode, the signal currents potentially flow in either direction between source and drain. At the same time, the gate has no RF signal applied but instead a DC bias that is digitally operated between a first and a second state. In the minimum admittance of "OFF" state, significant conduction of signal currents through the device is prevented. In the maximum admittance or "ON" state, conduction of signal currents take place. The operating point in the "ON" state is with zero gate bias, in the "OFF" state a negative voltage is applied, placed beyond pinch-off and below gate breakdown.

The term "passive" is here used to denote non-gain FET operation. In contrast, an amplifying FET has an applied DC potential difference between source and drain to provide an "active" mode having "transconductance". "Transconductance" is conductance defined with reference to current flow between source and drain in response to signal voltage applied to the gate electrode. In active operation, the FET consumes substantial DC power in amplifying the signal, exchanging DC power for RF gain. In passive operation, as herein defined, no DC power is consumed, except that dissipated in the gate circuit due to the non-ideal and finite value of gate leakage current. In practice, a variable gain amplifier typically consumes 250 mW of DC power in contrast to less than 1 mW for the passive attenuator.

A more meaningful comparison showing the advantage of a passive attenuator, as herein described, over a known variable gain device may be more properly made in the context of a receiving system in which the passive attenuator may be used to replace the variable gain amplifier (VGA).

In making such a comparison, one must make up the attenuation loss in the passive attenuator by providing additional gain. Assuming that the VGA provides 6 dB of gain (measured at mid-range), the passive attenuator provides 2 dB of attenuation (measured at mid-range) and requires 8 dB of additional gain to match the gain of the VGA. Meanwhile this additional amplifier may be expected to dissipate 0.25 watts of DC power. Considering only these two parameters, the two systems would be equal. However, where dynamic range is a principal concern, the passive attenuator provides a 5 to 10 dB improvement over the VGA.

This improvement may be appreciated in a more completely defined practical context. Assuming system requirements for a bandwidth of 1 megahertz and room temperature operation ($T_0 = 290K$), the spurious free dynamic range (SFDR) in dB of a VGA or passive attenuator may be expressed as follows:

$$SFDR = \tfrac{2}{3}(IP3 - NF - G + 114)$$

where
IP3 = Third Order Intercept Point

NF = Noise Figure
G = Gain.

Assuming a 12 dB range of gain variation for both the VGA and the passive attenuator, the following values apply:

| Variable Gain Amplifier | | | | Passive Attenuator/Ga | | |
|---|---|---|---|---|---|---|
| GAIN | NF | IP3 | SFDR | GAIN | NF | IP3 |
| +6 dB | 6 dB | +17 dBm | 79.3 dB | +6 dB | 6 dB | +25 d |
| −6 dB | 12 dB | +4 dBm | 74.6 dB | −6 dB | 18 dB | |

The result, as indicated by the above table, is that the passive attenuator has a 5.4 dB SFDR advantage at maximum gain over the VGA and a 10.1 dB SFDR advantage in the maximum attenuation state over the VGA.

There are other advantages in the "passive" operation herein described. The signal is exposed to a passive Pi-pad, a Tee-pad, or a bridged Tee-pad attenuator, which is reconfigurable, as a function of the number of "ON" segments in a two or three branch network. In passive operation, the attenuation steps, which are determined from individual conductances becomes primarily a function of the accuracy of the physical layout—the gate width of the segments of the FETs. Consequently the attenuation steps share this accuracy.

Since the control signal is not applied as an analog voltage to the gate electrode as in the variable gain amplifier, parameters causing uncertainty in device gain are also not at issue.

The analog gate control voltage settings of a conventional passive attenuator require use of a look-up table to account for GaAs MMIC process parameter variations. While the absolute conductance and the absolute return loss remain process sensitive in the present passive attenuator, the attenuation changes from setting to setting become independent of GaAs MMIC process parameter tolerances.

In addition, the digital gate voltage settings themselves, which determine the "ON-OFF" states in the present passive attenuator, do not require the high accuracy of analog gate voltages nor do they require high linearity of FET gain at different gate voltage settings that are required for accurate operation of the active variable gain amplifier. Thus the present passive attenuator, using digitally controlled segments, as herein disclosed provides an advantageous solution to the need for an attenuator of high accuracy.

Attenuator operation is limited by the possibility of overloading the passive networks in the presence of excessive signal levels. Thus the input signal should be kept at suitably low signal levels to insure that the attenuating FETs are not driven into a non-linear state. This problem may be avoided where high signal levels are encountered by the signal division measures shown in FIGS. 2 and 3.

What is claimed is:

1. An electronically reconfigurable Pi-pad attenuator providing a set of discrete attenuation states (S21 values) comprising
   A) a monolithic crystalline substrate suitable for forming mutually insulated metallizations and field effect transistors,
   B) a first metallization on said member forming a first note for application of an input signal and for internal signal connection,
   C) a second metallization forming a second node for internal signal connection and for derivation of an output signal,
   D) a third metallization forming a third node providing a common signal return for input, output and internal signals,
   E) three segmented single gate field effect transistors (FETs) formed on said substrate, each subdivided into a first (m), second (n) and third (o) plurality of selectively controlled FET segments respectively, each segment having a predetermined width to achieve a desired admittance and including
      (1) a first region having a first electrode in ohmic contact with said substrate,
      L(2) a second region, spaced from the first region, having a second electrode in ohmic contact with said substrate, and
      (3) a third region positioned between said first and second regions having a third electrode forming a gate for switching said segment to a high admittance "ON" state or to a low admittance "OFF" state in response to the state of a digital control potential,
   each of said (m) segments being serially connected between said first and third metallizations in separate parallel paths,
   each of said (n) segments being serially connected between said second and third metallizations in separate parallel paths,
   each of said (o) segments being serially connected between said first and second metallizations in separate parallel paths,
   F) means for maintaining said three metallizations at a common dc potential to facilitate passive, bidirectional conduction by the (m+n+o) segments of said three FETs with certain segments being in a high admittance "ON" state and other segments being in a low admittance "OFF" state in response to a binary control potential applied to the gate of each segment thereof, and
   G) a plurality of control terminals for applying said binary control potential to the gate of each of said (m+n+o) segments, selected combinations of binary control potentials producing particular attenuation states for said attenuator.

2. The attenuator set forth in claim 1, wherein
said first and second FETs nave an equal number of segments (i.e. m=n), the respective first segments being equal, the respective second segments being equal, ... and the respective $m^{th}$ segments being equal,
and wherein an (m+o) fold plurality of control terminals are provided, the m gate electrodes of the like dimensioned segments of said first and second FETs being connected to "m" control terminals in matched pairs to insure that said first and second FETs share equal admittance states, and the "o" gate electrodes of said third FET being individually connected to said "o" control terminals.

3. The attenuator set forth in claim 1, wherein
a first resistor is provided connected between said first and third metallizations,
a second resistor having a value equal to that of said first resistor is provided connected between said second and third metallizations, and wherein
a third resistor is provided connected between said first and second metallizations, said three resistors being selected to set the minimum admittances between said respective pairs of metallizations.

4. An attenuator as set forth in claim 3 for providing linear operation over an increased range of input signal power, wherein (m+n+o) signal voltage dividing resistors are provided, one serially connected with each segment between the respective metallization pairs, the value of each resistance being inversely proportional to the gate width of the associated segment for equal signal division at each segment.

5. An attenuator as set forth in claim 2 having a small signal transfer (S21) value compensated for phase wherein the virtual equivalent of each segment is a first series connected resistor and capacitor when the segment is "OFF", and a second resistor when the segment is "ON", the reactance of said capacitor being high in relation to the resistances of said first and second resistors at the operating frequency, and wherein a first resistor is provided connected between said first and third metallizations;

a second resistor having a value equal to that of said first resistor is provided connected between said second and third metallizations, and wherein a third resistor and an inductor are provided connected in series between said first and second metallizations, the resistances of said three resistors being selected to set the minimum admittances between said respective pairs of metallizations, and the inductance of said inductor is selected to minimize the phase dispersion due to the capacitances of said segments at said operating frequency.

6. The attenuator set forth in claim 3, wherein said monolithic crystalline substrate is a compound semiconductor having a high electron mobility suited to microwave or millimeter wave operation selected from the III-V and II-VI families.

7. An electronically reconfigurable Tee-pad attenuator providing a set of discrete attenuation states (S21 values), comprising A) a monolithic crystalline substrate suitable for forming mutually insulated metallizations and field effect transistors, B) a first metallization on said member forming a first node for application of an input signal, C) a second metallization forming a second node for internal signal connection, D) a third metallization forming a third node for derivation of an output signal, E) a fourth metallization forming a fourth node providing a common signal return for input, output and internal signals, F) three segmented single gate field effect transistors (FETs) formed on said member, each subdivided into a first (m), second (n) and third (o) plurality of selectively controlled FET segments, respectively, each segment having a predetermined width to achieve a desired admittance and including (1) a first region having a first electrode in ohmic contact with said substrate, (2) a second region, spaced from the first region, having a second electrode in ohmic contact with said substrate, and L(3) a third region positioned between said first and second regions having a third electrode forming a gate for switching said segment to a high admittance "ON" state or to a low admittance "OFF" state in response to the state of a digital control potential, each of said (m) segments being serially connected between said first and second metallizations in separate parallel paths, each of said (n) segments being serially connected between said second and third metallizations in separate parallel paths, and each of said (o) segments being serially connected between said second and fourth metallizations in separate parallel paths, G) means for maintaining said four metallizations at a common dc potential to facilitate passive, bidirectional conduction by the (m+n+o) segments of said three FETs with certain segments being in a high admittance "ON" state and other segments being in a low admittance "OFF" state in response to a binary control potential applied to the gate of each segment thereof, and H) a plurality of control terminals for applying said binary control potential to the gate of each of said (m+n+o) segments, selected combinations of binary control potentials producing particular attenuation states of said attenuator.

8. The attenuator set forth in claim 7, wherein said first and second FETs have an equal number of segments (i.e. m=n), the respective first segments being equal, the respective second segments being equal, . . . and the respective $m^{th}$ segments being equal, and wherein an (m+o) fold plurality of control terminals are provided, the m gate electrodes of the like dimensioned segments of said first and second FETs being connected to "m" control terminals in matched paris to insure that said first and second FETs share equal admittance states, and the "o" gate electrodes of said third FET being individually connected to said "o" control terminals.

9. The attenuator set forth in claim 8, wherein a first resistor is provided connected between said first and second metallizations;

a second resistor having a value equal to that of said first resistor is provided connected between said second and third metallizations, and wherein a third resistor is provided connected between said second and fourth metallizations, said three resistors being selected to set the minimum admittances between said respective pairs of metallizations.

10. An attenuator as set forth in claim 9 for providing linear operation over an increased range of input signal power, wherein (m+n+o) signal voltage dividing resistors are provided, one serially connected with each segment between the respective metallization pairs, the value of each resistance being inversely proportional to the gate width of the associated segment for equal signal division at each segment.

11. An attenuator as set forth in claim 8 having a small signal transfer (S21) value compensated for phase wherein the virtual equivalent of each segment is a first series connected resistor and capacitor when the segment is "OFF", and a second resistor when the segment is "ON", the reactance of said capacitor being high in relation to the resistances of said first and second resistors at the operating frequency, and wherein a first resistor and a first inductor are serially connected between said first and second metallizations;

a second resistor and a second inductor having values equal to those of said first resistor and said first inductor, respectively, are serially connected between said second and third metallizations, and wherein a third resistor is provided connected in series between said second and fourth metallizations, the resistances of said three resistors being selected to set the minimum admittances between said respective pairs of metallizations, and the inductance of said inductors are selected to minimize the phase dispersion due to the capacitances of said segments at said operating frequency.

12. The attenuator set forth in claim 9, wherein said monolithic crystalline substrate is a compound semiconductor having a high electron mobility suited to microwave or millimeter wave operation selected from the III-V or II-VI families.

13. An electronically reconfigurable bridged Tee-pad attenuator providing a set of discrete attenuation states (S21 values), comprising
A) a monolithic crystalline substrate suitable for forming mutually insulated metallizations and field effect transistors,
B) a first metallization on said substrate forming a first node for application of an input signal,
C) a second metallization forming a second node for internal signal connection,
D) a third metallization forming a third node for derivation of an output signal,
E) a fourth metallization forming a fourth node providing a common signal return for input, output and internal signals,
F) two segmented single gate field effect transistors (FETs) formed on said substrate, each subdivided into a first (m) and second (n) plurality of selectively controlled FET segments, respectively, each segment having a predetermined width to achieve a desired admittance and including
  (1) a first region having a first electrode in ohmic contact with said substrate,
  (2) a second region, spaced from the first region, having a second electrode in ohmic contact with said substrate, and
  (3) a third region positioned between said first and second regions having a third electrode forming a gate for switching said segment to a high admittance "ON" state or to a low admittance "OFF" state in response to the state of a digital control potential, each of said (m) segments being serially connected between said first and third metallizations in separate parallel paths, each of said (n) segments being serially connected between said second and fourth metallizations in separate parallel paths, G) a first and a second resistor of equal values each having one terminal connected to said second metallization, the pair being serially connected between said first and third metallizations, h) means for maintaining said two metallizations at a common dc potential to facilitate passive, bidirectional conduction by the (m+n) segments of said two FETs with certain segments being in a high admittance "ON" state and other segments being in a low admittance "OFF" state in response to a binary control potential applied to the gate of each segment thereof, and I) an (m+n) fold plurality of control terminals for applying said binary control potential to the gate of each of said l(m+n) segments, selected combinations of binary control potentials producing particular attenuation states for said attenuator.

14. The attenuator set forth in claim 11, wherein a third resistor is provided connected between said first and third metallizations, and a a fourth resistor is provided connected between said second and fourth metallizations, and wherein said two resistors being selected to set the minimum admittances between said respective pairs of metallizations.

15. An attenuator as set forth in claim 14 for providing linear operation over an increased range of input signal power, wherein (m+n) signal voltage dividing resistors are provided, one serially connected with each segment between the respective metallization pairs, the value of each resistance being inversely proportional to the gate width of the associated segment for equal signal division at each segment.

16. An attenuator as set forth in claim 13 having a small signal transfer (S21) value compensated for phase wherein the virtual equivalent of each segment is a first series connected resistor and capacitor when the segment is "OFF", and a second resistor when the segment is "ON", the reactance of said capacitor being high in relation to the resistances of said first and second resistors at the operating frequency, and wherein a first resistor and a first inductor are serially connected between said first and third metallizations; and a second resistor and a second inductor are serially connected between said second and fourth metallizations;

the resistances of said first and second resistors being selected to set the minimum admittances between said respective pairs of metallizations, and the inductance of said inductor is selected to minimize the phase dispersion due to the capacitances of said segments at said operating frequency.

17. The attenuator set forth in claim 14, wherein said monolithic crystalline substrate is a compound semiconductor having a high electron mobility suited to microwave or millimeter wave operation selected from the III-V or II-VI families.

* * * * *